United States Patent
Kutsukake et al.

(10) Patent No.: US 8,400,812 B2
(45) Date of Patent: Mar. 19, 2013

(54) SEMICONDUCTOR MEMORY DEVICE

(75) Inventors: Hiroyuki Kutsukake, Kanagawa-ken (JP); Kikuko Sugimae, Kanagawa-ken (JP); Mitsuhiro Noguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/231,510

(22) Filed: Sep. 13, 2011

(65) Prior Publication Data

US 2012/0236619 A1    Sep. 20, 2012

(30) Foreign Application Priority Data

Mar. 18, 2011 (JP) .................. 2011-060938

(51) Int. Cl.
*G11C 5/06* (2006.01)
*G11C 5/02* (2006.01)
*G11C 16/04* (2006.01)

(52) U.S. Cl. ......... 365/72; 365/51; 365/63; 365/185.11; 365/185.17

(58) Field of Classification Search ...... 365/72
See application file for complete search history.

(56) References Cited

U.S. PATENT DOCUMENTS

| | | | | |
|---|---|---|---|---|
| 6,507,508 | B2 * | 1/2003 | Hosono et al. | 365/63 |
| 7,158,398 | B2 * | 1/2007 | Shimizu et al. | 365/63 |
| 7,245,534 | B2 * | 7/2007 | Goda et al. | 365/185.17 |
| 7,583,533 | B2 | 9/2009 | Kutsukake et al. | |
| 7,755,944 | B2 * | 7/2010 | Hwang et al. | 365/185.11 |
| 7,911,844 | B2 * | 3/2011 | Nakamura et al. | 365/185.17 |
| 8,233,325 | B2 * | 7/2012 | Sakurai et al. | 365/185.17 |
| 2010/0124117 | A1 * | 5/2010 | Kutsukake et al. | 365/185.11 |
| 2011/0019477 | A1 * | 1/2011 | Hashimoto et al. | 365/185.11 |
| 2011/0073926 | A1 * | 3/2011 | Kutsukake | 257/314 |

FOREIGN PATENT DOCUMENTS

JP        2007-242700        9/2007

* cited by examiner

*Primary Examiner* — Son Mai
(74) *Attorney, Agent, or Firm* — Oblon, Spivak, McClelland, Maier & Neustadt, L.L.P.

(57) ABSTRACT

According to one embodiment, a semiconductor memory device includes a memory array and a peripheral circuit. The memory array has a plurality of memory cells, word lines, and bit lines, in which a first, second, and third blocks are set in the order along the bit line. The peripheral circuit has a transistor group. The transistor group includes a first transfer transistor belonging to the first block, a second transfer transistor belonging to the second block, and a third transfer transistor belonging to the third block. The first, second, and third transfer transistors share the other of a source and a drain of each. With regard to a direction in which either of the source and the drain is connected to the other in each of the first, second, and third transfer transistors, the directions of the adjacent transfer transistors are different from each other by 90° or 180°.

16 Claims, 9 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2011-060938, filed on Mar. 18, 2011; the entire contents of which are incorporated herein by reference.

FIELD

Embodiments described herein relate generally to a semiconductor memory device.

BACKGROUND

A semiconductor memory device is provided with a memory cell that stores data and a peripheral circuit that controls operations of data writing, reading, erasing and the like with respect to the memory cell. For example, an NAND-type flash memory has a charge accumulating layer which accumulates a charge as a memory cell and a cell transistor. In the memory cell region, a plurality of memory cells are arranged in a matrix state, the memory cell to be operated is selected by the peripheral circuit arranged in the periphery of the memory cell region so that the operations such as data writing, reading, erasing and the like are performed.

Here, a relatively high voltage is applied to a transfer transistor in the peripheral circuit in order to drive the memory cells. Therefore, the size of the transfer transistor is larger than that of the cell transistor. In the semiconductor memory device including with the above peripheral circuit, further size reduction is in demand.

DETAILED DESCRIPTION

Figure 1:
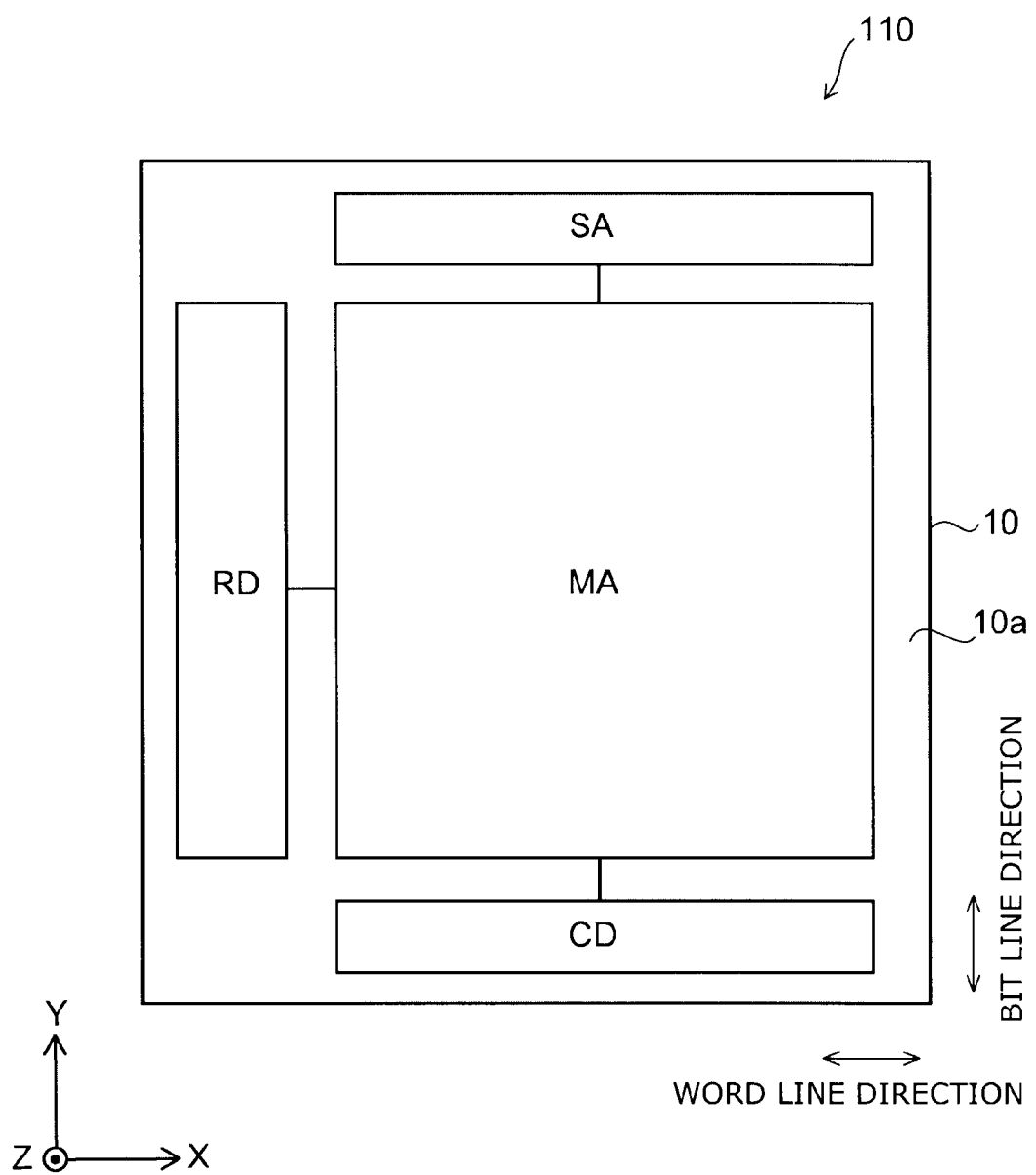
FIG. 1 is a block diagram illustrating a configuration of a semiconductor memory device according to an embodiment.

In general, according to one embodiment, a semiconductor storage device includes a memory array and a peripheral circuit. The memory array includes a plurality of memory cells arranged on a substrate in a matrix state, a plurality of word lines, each of the word lines commonly connected to the memory cells in a common row among the plurality of memory cells, and a plurality of bit lines, each of the bit lines commonly connected to the memory cells in a common column among the plurality of memory cells. A first block, a second block, and a third block are set in the order along the bit line in the memory array. A first block, a second block, and a third block are include the plurality of memory cells. The peripheral circuit includes a transistor group. The transistor group are formed on the substrate. The transistor group has a first transfer transistor, one of a source and a drain of the first transfer transistor being connected to a part of the word lines belonging to the first block, a second transfer transistor, one of a source and a drain of the second transfer transistor being connected to a part of the word lines belonging to the second block; and a third transfer transistor, one of a source and a drain of the third transfer transistor being connected to a part of the word lines belonging to the third block. The first transfer transistor, the second transfer transistor, and the third transfer transistor share one other of the source and the drain. A direction connecting the source to the drain in each of the first transfer transistor, the second transfer transistor, and the third transfer transistor are different from each other by 90° or 180°.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted as appropriate.

(First Embodiment)

FIG. 1 is a block diagram illustrating a configuration of a semiconductor memory device according to an embodiment.

As illustrated in FIG. 1, a semiconductor memory device 110 according to the embodiment is an NAND-type flash memory.

That is, the NAND-type flash memory has a memory array MA on which a plurality of memory cells are provided and a row decoder RD provided in the periphery of the memory array MA. The row decoder RD is a peripheral circuit. In the periphery of the memory array MA, peripheral circuits including a column decoder CD, a sense amp SA and the like are provided in addition to the row decoder RD.

The memory array MA, the peripheral circuits (row decoder RD, column decoder CD, sense amp SA and the like) are formed on a substrate 10 made of silicon, for example. In the embodiment, one of the directions along a major surface 10a of the substrate 10 is referred to as the X-axis direction, the direction along the major surface 10a and orthogonal to the X-axis direction as the Y-axis direction, and the direction orthogonal to the X-axis direction and the Y-axis direction (the direction orthogonal to the major surface 10a) as the Z-axis direction FIG. 2 is a diagram illustrating a circuit example of the semiconductor memory device according to the embodiment.

Figure 2:
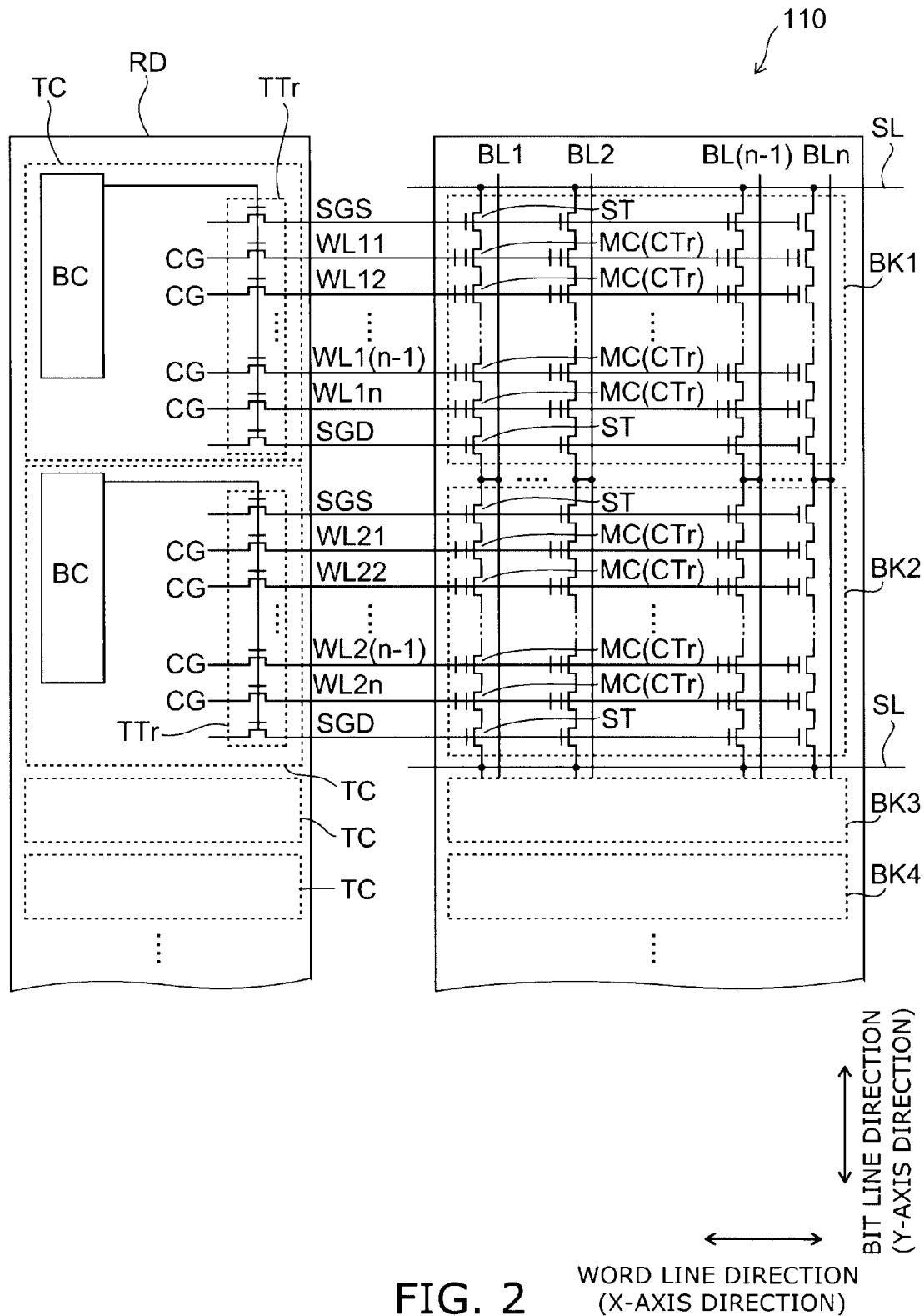
FIG. 2 is a diagram illustrating a circuit example of the semiconductor memory device according to the embodiment.

In FIG. 2, a circuit example of the memory array and the peripheral circuits are exemplified.

That is, as illustrated in FIG. 2, the memory array MA has a plurality of memory cells MC arranged in the matrix state along the major surface 10a of the substrate 10. The memory cell MC includes a memory cell transistor. The memory cell transistor CTr is provided with a tunnel insulating film, a floating electrode provided on the tunnel insulating film, a gate insulating film provided on the floating electrode, and a control electrode provided on the gate insulating film.

The memory array MA has a plurality of word lines WL, each being commonly connected to the memory cells MC among the same row in the plurality of memory cells MC and a plurality of bit lines BL, each being commonly connected to the memory cells MC in the same column among the plurality of memory cells. That is, on the memory array MA, the plurality of word lines WL and the plurality of bit lines BL are provided. For convenience of explanation, it is assumed that the word lines WL are provided extending in the X-axis direction, and the bit lines BL are provided extending in the Y-axis direction. Also, the direction in which the word lines WL extend is referred to as a word line direction, and the direction in which the bit lines BL extend as a bit-line direction.

The memory array MA is divided into a plurality of blocks along the bit lines BL. The plurality of memory cells MC provided on the memory array MA belong to any of these plural blocks. In the embodiment, at least four blocks are set. As an example, on the memory array MA, $2 \times 2^{10}$ pieces (2048) pieces of blocks are provided. In the embodiment, four blocks (first block BK1, second block BK2, third block BK3, and fourth block BK4) in the plurality of blocks will be mainly described. In the embodiment, if each block is not discriminated from each other, it is collectively referred to as the block BK.

On each block BK, a plurality of word lines WL are provided, respectively. To these plural word lines WL, the memory cell MC belonging to the block BK is connected.

Here, it is assumed that n pieces (n is an integer not less than 1) of word lines WL are provided on each block BK. The word lines belonging to the first block BK1 are WL11, 12, ..., and WL1(n-1), and WL1n. Also, the word lines belonging to the second block BK2 are WL21, 22, ..., and WL2(n-1), and WL2n. Also, the word lines belonging to the third block BK3 are WL31, 32, ..., and WL3(n-1), and WL3n. Also, the word lines belonging to the fourth block BK4 are WL41, 42, ..., and WL4(n-1), and WL4n. If each word line is not discriminated from each other, it is referred to as the word line WL.

As an example, on one block BK, 64 word lines WL are provided. Also, on the both sides of the plural word lines WL of each block BK, selection gate electrodes (SGS and SDG) are provided.

A plurality of the bit lines BL are provided in a direction orthogonal to the word line WL. In the embodiment, it is assumed that m pieces (m is an integer not less than 1) of the bit lines BL are provided. The m pieces of the bit lines are BL1, BL2, ..., BL(m-1), and BLm. If each bit line is not discriminated from each other, it is referred to as the bit line BL.

To each bit line BL in one block BK, memory cell transistors CTr in the number corresponding to the number of the word lines WL are connected in series, respectively. Therefore, on one block BK, the number m of the bit lines BL×the number n of the word lines WL, which results in the total of m×n memory cell transistors CTr, are provided.

On the row decoder RD, a transfer circuit portion TC corresponding to each block BK is provided. On the transfer circuit portion TC, transfer transistors TTr connected to the word line WL, the selection gate electrodes SGS and SDG, respectively, are provided. Gates of the plurality of transfer transistors TTr included in one transfer circuit portion TC are commonly interconnected. To the common gates, a voltage is applied from a booster circuit BC with predetermined timing. If this voltage is applied, the block BK corresponding to the transfer circuit portion TC is selected.

In the embodiment, the transfer transistors to be connected to each of the word lines WL11, 12, ..., WL1(n-1), and WL1n of the first block BK1 are TTr11, 12, ..., TTr1(n-1), and TTr1n. Also, the transfer transistors to be connected to each of the word lines WL21, 22, ..., and WL2(n-1), and WL2n of the second block BK2 are TTr21, 22, ..., TTr2(n-1), and TTr2n. Also, the transfer transistors to be connected to each of the word lines WL31, 32, ..., and WL3(n-1), and WL3n of the third block BK3 are TTr31, 32, ..., TTr3(n-1), and TTr3n. Also, the transfer transistors to be connected to each of the word lines WL41, 42, ..., and WL4(n-1), and WL4n of the fourth block BK4 are TTr41, 42, ..., TTr4(n-1), and TTr4n. If each transfer transistor is not discriminated from each other, it is referred to as the transfer transistor TTr.

The transfer transistor TTr is an MOS (Metal Oxide Semiconductor) type transistor or an MIS (Metal Insulator Semiconductor) type transistor, for example. For the transfer transistor TTr, a high breakdown voltage type is used so that a voltage higher than a supply voltage can be transferred. The word line WL is connected to either of a source S and a drain D of the transfer transistor TTr. The other of the source S and the drain D of the transfer transistor TTr is connected to a driving signal line CG. In the embodiment, either of the source S and the drain D is explained as the drain D and the other as the source S, but it is also applicable if the one is the source S and the other is the drain D. To the driving signal line CG, signals for driving the memory cell transistor CTr such as a writing voltage, a reading voltage, an erasing voltage and the like are sent.

Figure 3:
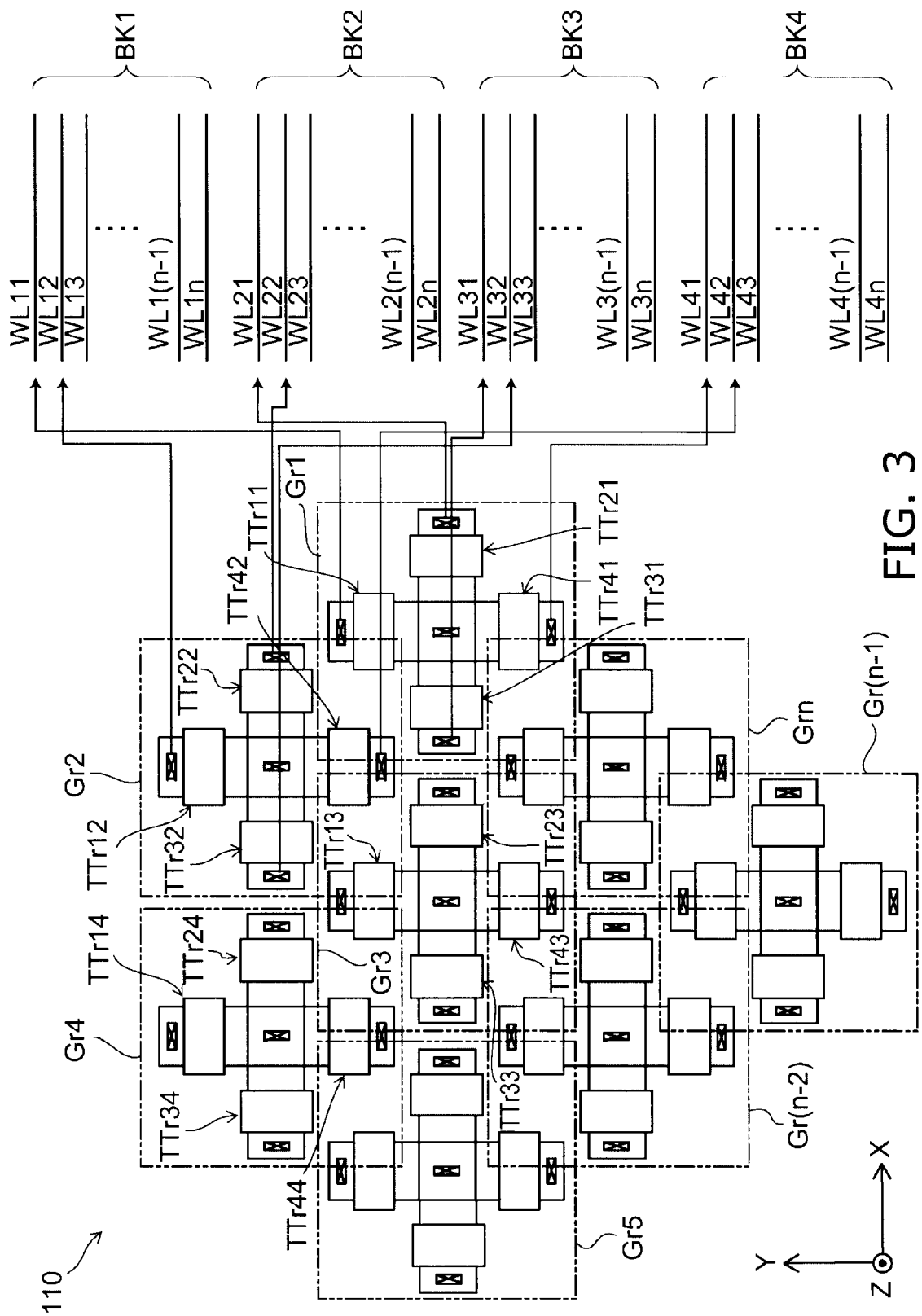
FIG. 3 is a schematic plan view illustrating a layout of a transfer transistor of the semiconductor memory device according to the embodiment.

FIG. 3 is a schematic plan view illustrating a layout of the transfer transistor of the semiconductor memory device according to the embodiment.

In FIG. 3, a part of the transfer transistor is enlarged in illustration.

Figure 4:
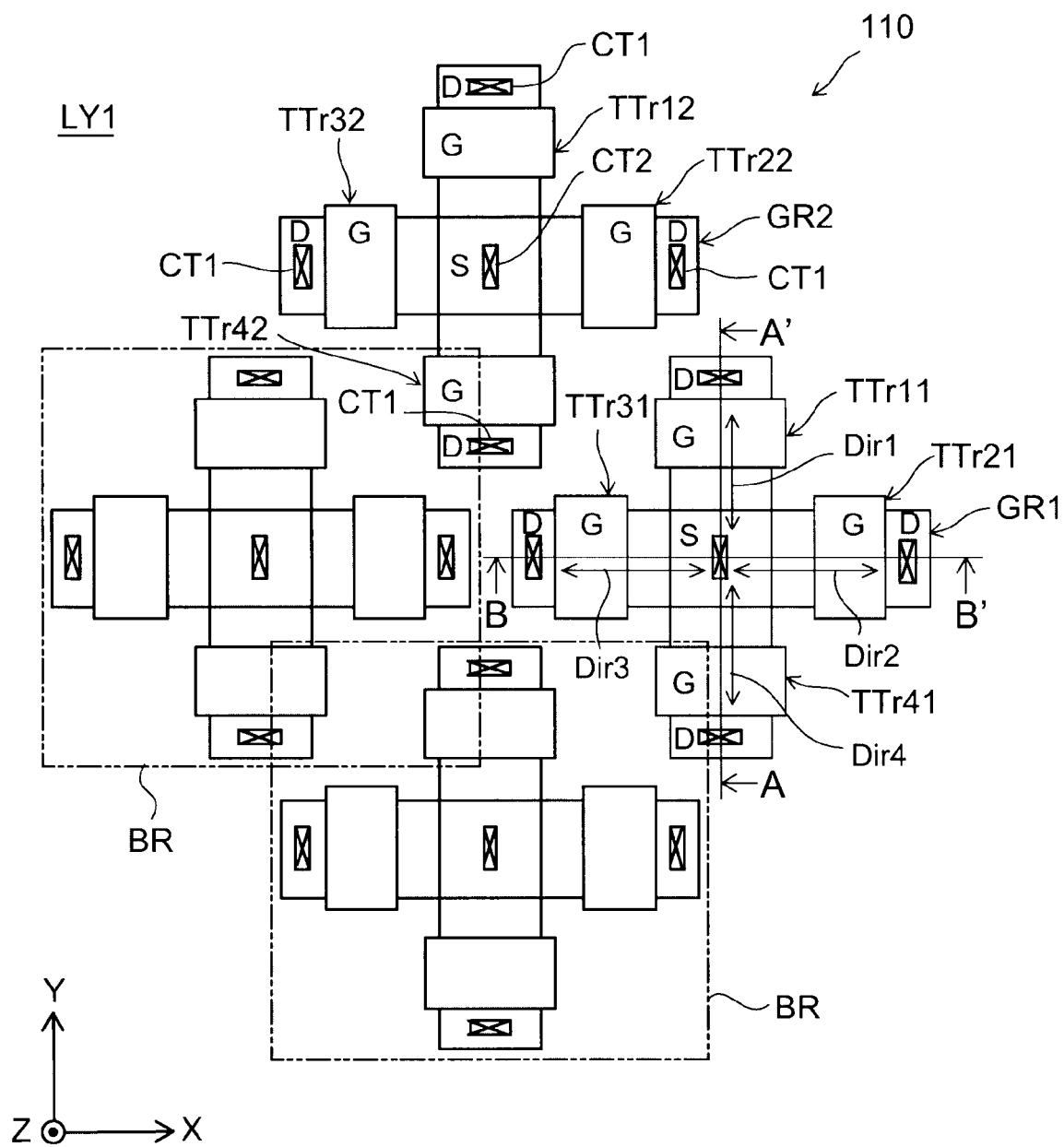
FIG. 4 is an enlarged schematic plan view of transistor groups.

FIG. 4 is an enlarged schematic plan view of transistor groups.

As illustrated in FIG. 3 and FIG. 4, the semiconductor memory device 110 according to the embodiment has the transistor groups. The transistor group is a group of a plurality of the transfer transistors. Here, if the plurality of transistor groups are not discriminated from each other, they are referred to as the transistor group Gr.

In the embodiment, four transfer transistors TTr constitute one transistor group Gr. That is, the transistor group Gr is provided with a first transfer transistor, a second transfer transistor, a third transfer transistor, and a fourth transfer transistor.

The first transfer transistor is any one of the transfer transistors TTr11, 12, ..., TTr1(n-1) and TTr1n connected to each of the word lines WL11, 12, ..., WL1(n-1), and WL1n of the first block BK1.

The second transfer transistor is any one of the transfer transistors TTr21, 22, ..., TTr2(n-1) and TTr2n connected to each of the word lines WL21, 22, ..., WL2(n-1), and WL2n of the second block BK2.

The third transfer transistor is any one of the transfer transistors TTr31, 32, ..., TTr3(n-1) and TTr3n connected to each of the word lines WL31, 32, ..., WL3(n-1), and WL3n of the third block BK3.

The fourth transfer transistor is any one of the transfer transistors TTr41, 42, ..., TTr4(n-1) and TTr4n connected to each of the word lines WL41, 42, ..., WL4(n-1), and WL4n of the fourth block BK4.

The source S of each of the first transfer transistor, the second transfer transistor, the third transfer transistor, and the fourth transfer transistor is made common.

Also, as for directions Dir1, Dir2, Dir3, and Dir4 in which the drains D and the sources S of the first transfer transistor, the second transfer transistor, the third transfer transistor, and the fourth transfer transistor are connected, respectively, the directions Dir1, Dir2, Dir3, and Dir4 of the transfer transistors adjoining along a major surface 10a of a substrate 10 are different from each other by 90°.

That is, in one transistor group Gr, four transfer transistors TTr are laid out radially from the respective sources S. In an example illustrated in FIG. 3, the directions Dir1, Dir2, Dir3, and Dir4 in which the drains D and the sources S are connected are rotated from each other by 90°, that is, the transistors are laid out in a so-called cross shape.

Such a layout of the transfer transistors TTr will be referred to as a layout LY1.

Here, the transfer transistors TTr constituting one transistor group Gr correspond to different blocks BK, respectively. For example, the transistor group Gr1 is constituted by the transfer transistors TTr11, TTr21, TTr31, and TTr41. The transfer transistor TTr11 is connected to the word line WL11 of the first block BK1. The transfer transistor TTr21 is connected to the word line WL21 of the second block BK2. The transfer transistor TTr31 is connected to the word line WL31 of the third block BK3. The transfer transistor TTr41 is connected to the word line WL41 of the fourth block BK4.

The four transfer transistors TTr constituting the transistor group Gr may be connected to any of the word lines WL in the respective block BK as long as the block BK is different. In the embodiment, for facilitation of the explanation, in the transistor group Gr1, it is assumed that the transfer transistors TTr connected to the first word line WL of the respective blocks BK are combined. Similarly, it is assumed that in the transistor group Gr2, the transfer transistors TTr connected to the second word line WL of the respective block BK are combined.

The transfer transistor TTr is driven in each block BK. Therefore, even if either of the source S or the drain D is made common in the plurality of transfer transistors TTr corresponding to different blocks BK, operations do not interfere with each other.

Figure 5A:
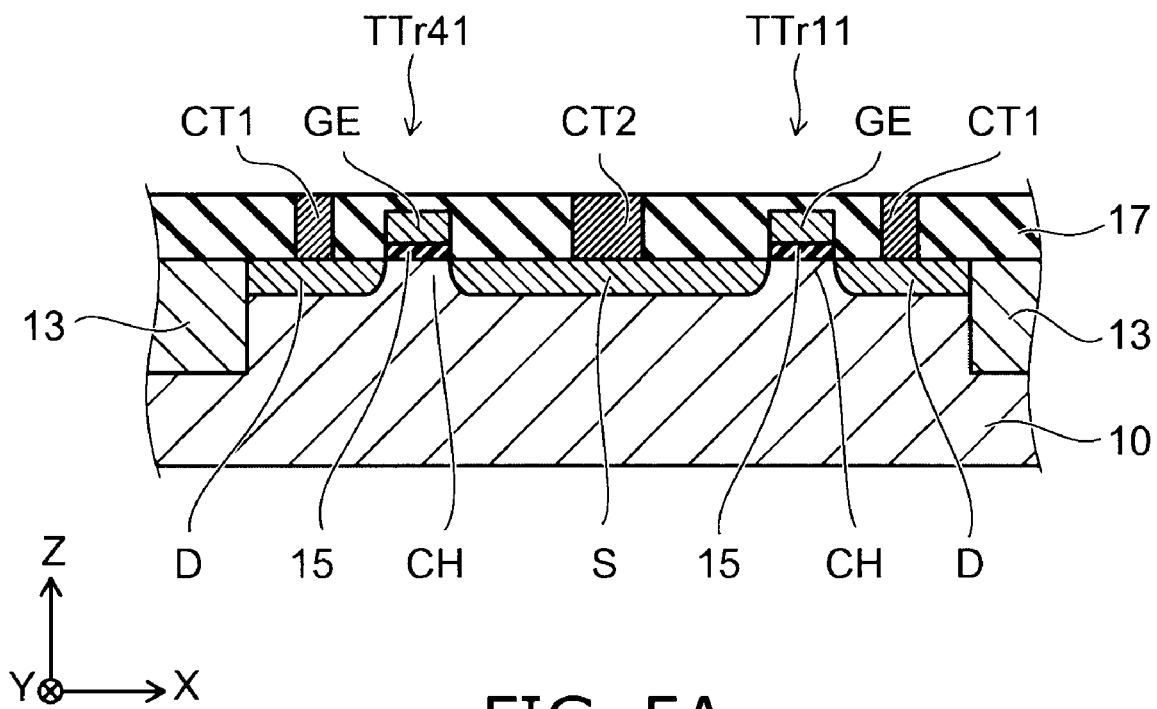
FIGS. 5A and 5B are schematic sectional diagrams illustrating a part of FIG. 4.
Figure 5B:
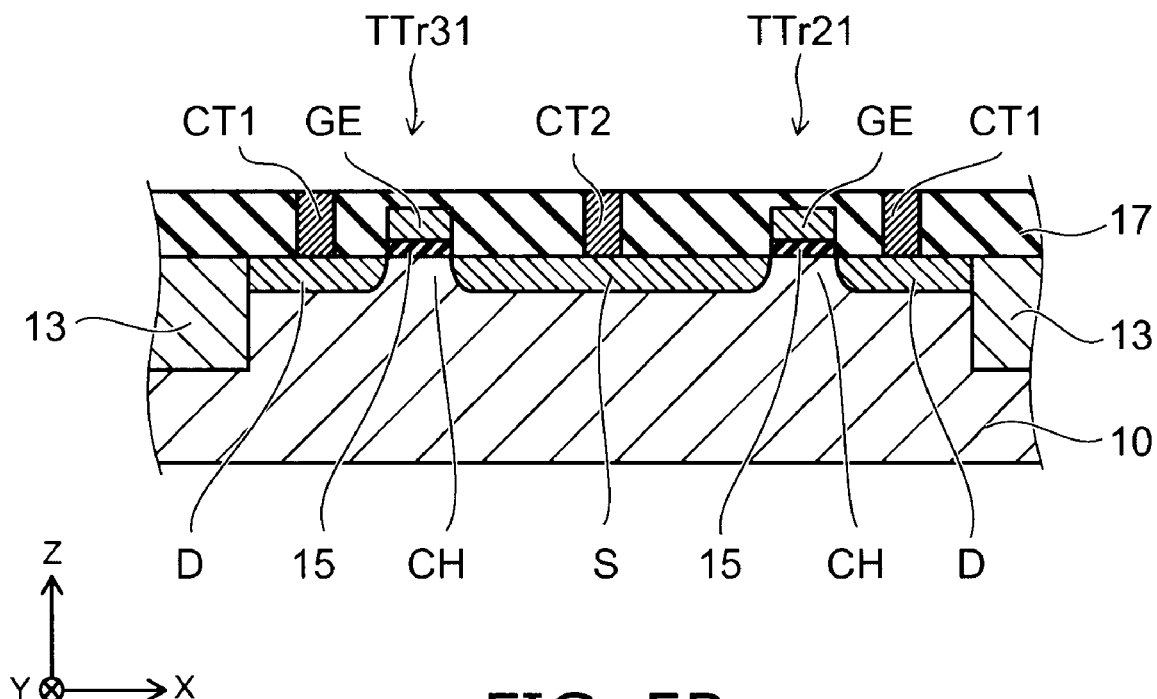

FIGS. 5A and 5B are schematic sectional diagrams illustrating a part of FIG. 4.

That is, FIG. 5A is a sectional view on arrow of an A-A' line in FIG. 4, and FIG. 5B is a sectional view on arrow of a B-B' line in FIG. 4.

As illustrated in FIGS. 5A and 5B, the transfer transistors TTr11, TTr21, TTr31, and TTr41 are formed between element separation regions 13 formed on the silicon substrate 10, for example. The source S and the drain D are formed between the element separation regions 13. The source S is shared as one ends of current paths of the transfer transistors TTr11, TTr21, TTr31, and TTr41. On the other hand, the drain D is provided separately as one ends of the current paths of the transfer transistors TTr11, TTr21, TTr31, and TTr41.

Between the source S and the drain D, channels CH corresponding to each of the transfer transistors TTr11, TTr21, TTr31, and TTr41 are provided. On each of the channels CH, gate electrodes GE are formed through gate insulating films 15.

On each of the drains D, a first contact interconnect CT1 penetrating an inter-layer insulating film 17 is formed. Also, on the common source S, a second contact interconnect CT2 penetrating the inter-layer insulating film 17 is provided.

As described above, since in one transistor group Gr, four transfer transistors TTr share the source S, the area occupied by the transfer transistors TTr can be made smaller in this layout LY1 than the case in which the four transfer transistors TTr are formed independently.

Also, as illustrated in FIG. 3, in one transistor group Gr, the direction Dir1 of the first transfer transistor and the direction Dir4 of the fourth transfer transistor are different from each other by 180°. For example, in the transistor group Gr1, the direction Dir1 of the transfer transistor TTr11 and the direction Dir4 of the transfer transistor TTr41 are arranged differently from each other by 180°.

Moreover, the first transfer transistor (transfer transistor TTr11) is arranged at a position closer to the first block BK1 than the fourth transfer transistor (transfer transistor TTr41).

Also, the fourth transfer transistor (transfer transistor TTr41) is arranged at a position closer to the fourth block BK4 than the first transfer transistor (transfer transistor TTr11).

That is, the first transfer transistor and the fourth transfer transistor arranged along the direction (bit line direction) in which the blocks BK are aligned are arranged so that the alignment order of the first block BK1 and the fourth block BK4 matches the alignment order of the first transfer transistor and the fourth transfer transistor. Thus, a interconnect distance between the first transfer transistor and the word line WL of the first block BK1 and a interconnect distance between the fourth transfer transistor and the word line of the fourth block BK4 can be made shorter, respectively, and wiring can be facilitated.

Also, the semiconductor memory device 110 according to the embodiment has a plurality of the transistor groups Gr. That is, in the semiconductor memory device 110, n groups of the transistor groups Gr corresponding to the number of n pieces of the word lines WL corresponding to each of the blocks BK are provided in the first block BK1 to the fourth block BK4.

Here, in the plurality of transistor groups Gr, it is preferable that arrangements of the respective four transfer transistors TTr along the major surface 10a of the substrate 10 are aligned with each other. For example, in the transistor group Gr exemplified in FIG. 3 and FIG. 4, the first transfer transistor corresponding to the first block BK1 and the fourth transfer transistor corresponding to the fourth block BK4 are arranged along the bit line direction, and the second transfer transistor corresponding to the second block BK2 and the third transfer transistor corresponding to the third block BK3 are arranged along the word line direction. In the plurality of transistor groups Gr, the alignment orders of the transfer transistors are the same.

With such arrangements, in the adjacent transistor groups Gr, the transfer transistors TTr which are closest to each other correspond to different blocks BK. For example, between the adjacent transistor group Gr1 and transistor group Gr2, the first transfer transistor (transfer transistor TTr11) of the transistor group Gr1 is arranged close to the second transfer transistor (transfer transistor TTr22) of the transistor group Gr2. Also, the third transfer transistor (transfer transistor TTr13) of the transistor group Gr1 is arranged close to the fourth transfer transistor (transfer transistor TTr24) of the transistor group Gr2. In either case, the transfer transistors TTr corresponding to the same block BK are not arranged close to each other.

To the transfer transistors TTr, a voltage is applied to the gates in the same block BK at the same time. On the other hand, a voltage is not applied to the gates in the different blocks BK at the same time. According to the embodiment, in the layout of the transistor groups Gr, the transfer transistor TTr corresponding to another block BK is arranged between the transfer transistors TTr in the same block BK. Therefore, occurrence of leak caused by punch through between the transfer transistors TTr operating in the same block BK can be effectively suppressed.

As described above, in the embodiment, the transfer transistors TTr in which the voltage is applied to the gates at the same time do not adjoin each other. That is, there is no need to provide a shield (shield polysilicon, for example) that prevents leak by punch through between the adjacent transfer transistors TTr. As a result, a manufacturing process can be simplified, and the area can be reduced by the portion for the shield.

Moreover, in the embodiment, the plurality of transistor groups Gr are arranged in the matrix state. Furthermore, the adjacent transistor groups Gr are arranged alternately in the row direction and the column direction, respectively. For example, as illustrated in FIG. 3, if a plurality of the transistor groups Gr are arranged in the X-axis direction and in the Y-axis direction, the plurality of transistor groups Gr are arranged in a so-called staggered state. Specifically, in the transistor groups Gr1, Gr3, Gr5, . . . and the transistor groups Gr2, Gr4, . . . in the same columns in the X-axis direction, the transistor groups Gr in the adjacent rows are arranged in a state shifted in the X-axis direction by a half pitch. Also, for example, in the transistor groups Gr2, Grn, . . . and the transistor groups Gr3, Gr(n-1), . . . in the same rows in the Y-axis direction, the transistor groups Gr in the adjacent rows are arranged in a state shifted in the Y-axis direction by a half pitch.

In the transistor group Gr, the four transfer transistors TTr are laid out in a so-called cross shape. Thus, if the plurality of transistor groups Gr are arranged in the so-called staggered state, one of the transfer transistors TTr of the transistor group Gr in the adjacent column or row is arranged between the two transfer transistors TTr of the adjacent transistor groups Gr in the X-axis direction and the Y-axis direction, respectively. As a result, waste in the layout can be suppressed, and the area occupied by the transfer transistors TTr can be reduced.

In such a layout of the transistor groups Gr, the layout can be made more efficient by forming the shape of circumscribed rectangle (See a broken line BR in FIG. 4) seen from the Z-axis direction of the transistor group Gr into a regular square.

Here, in the four transfer transistors in one transistor group Gr, distances from the common source region to end portions of the drain regions of the transfer transistors are set equal. As a result, arrangement space can be efficiently used, and the area occupied by the transfer transistors TTr can be reduced.

Figure 6:
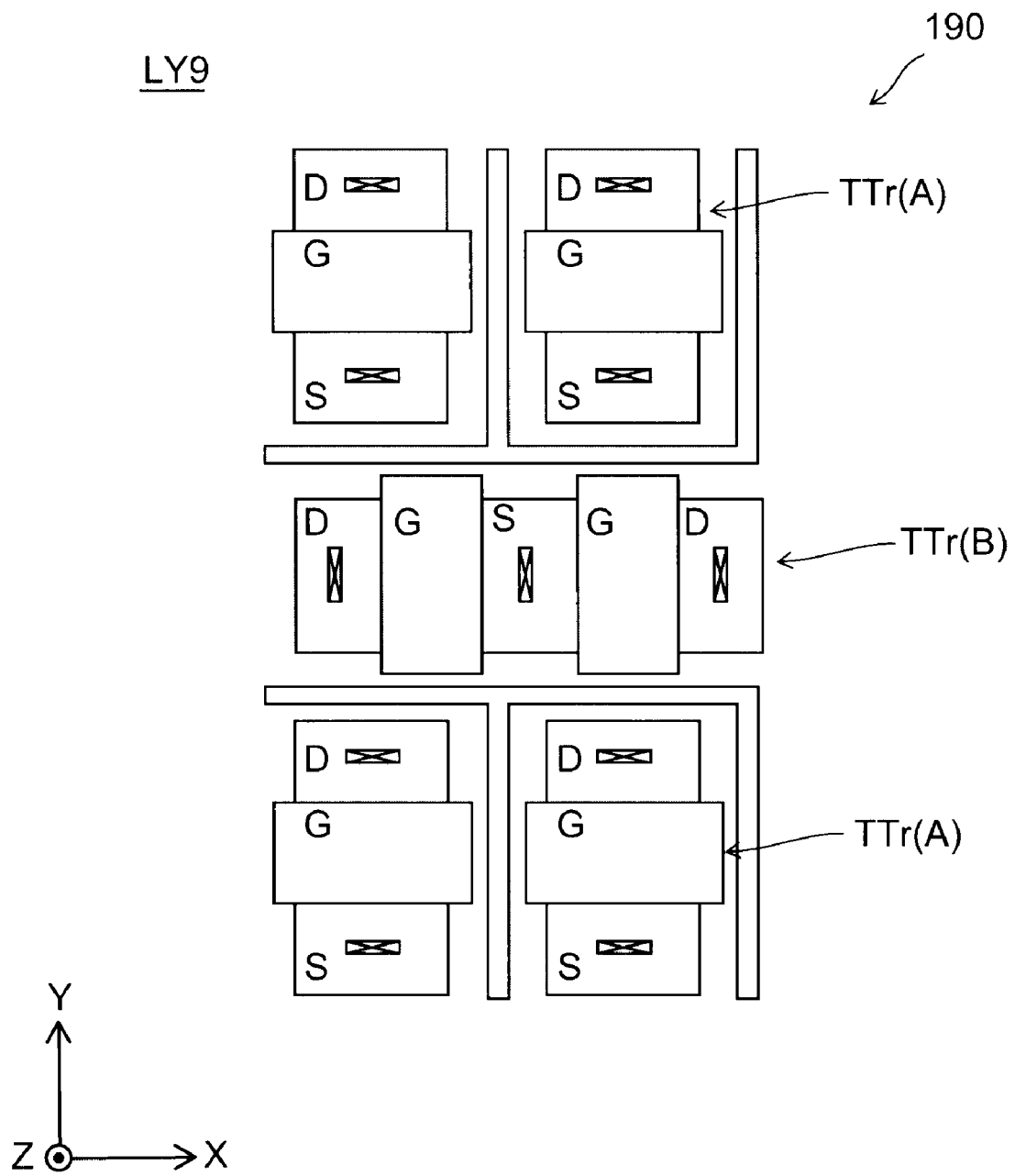
FIG. 6 is a schematic plan view illustrating a reference example.

FIG. 6 is a schematic plan view illustrating a layout of the transfer transistors according to a reference example.

As illustrated in FIG. 6, in the layout of the transfer transistors TTr of a semiconductor memory device 190 according to the reference example, the direction in which the source S and the drain D of the transfer transistor TTr are connected (hereinafter referred to as a "transistor direction") is different from each other by 90°. That is, the transfer transistor TTr(A) is a fifth transfer transistor. The transfer transistor TTr(B) is a sixth transfer transistor. The transfer transistor TTr(B) adjoins the transfer transistor TTr(A) along the Y-axis direction.

For example, the transistor direction of the plurality of transfer transistors TTr(A) in the same column in the X-axis direction is the Y-axis direction. Also, the transistor direction of the plurality of transfer transistors TTr(B) in the same column in the X-axis direction is the X-axis direction. Such transfer transistors TTr(A) and the transfer transistors TTr(B) are arranged alternately in the Y-axis direction. Such a layout of the transfer transistors TTr(A) and the TTr(B) is referred to as a layout LY9.

In the layout LY9 of the transfer transistors according to the reference example, in order to suppress leak caused by punch through between the adjacent transfer transistors TTr, a shield is provided so as to surround the transfer transistors TTr.

Here, with regard to the transfer transistors TTr in the same number, the occupied area by the layout LY1 of the transfer transistors TTr according to the embodiment is compared with the occupied area by the layout LY9 of the transfer transistors TTr according to the reference example. Then, assuming that the length of each occupied area in the Y-axis direction is constant, the length in the X-axis direction can be drastically reduced.

(Second Embodiment)

Figure 7:
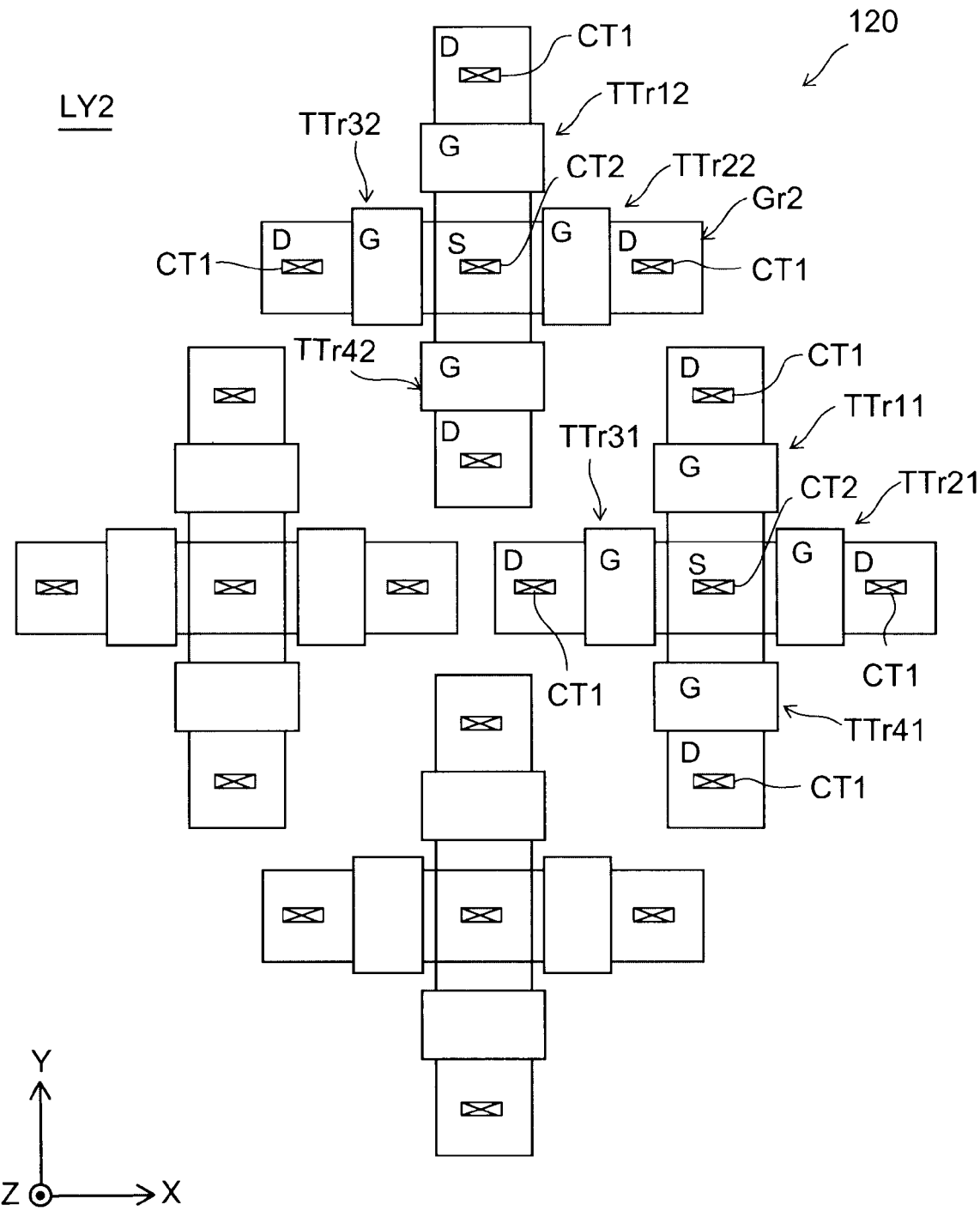
FIGS. 7 to 9 are schematic plan views for explaining another embodiment.

FIG. 7 is a schematic plan view for explaining a second embodiment.

In FIG. 7, a layout of the transfer transistors TTr of a semiconductor memory device 120 according to the second embodiment is exemplified.

In this layout of the transfer transistors TTr, the shapes of the first and second contact interconnects CT1 and CT2 are different from those in the layout of the transfer transistors TTr of the semiconductor memory device 110 according to the first embodiment exemplified in FIG. 5.

That is, in the second embodiment illustrated in FIG. 7, the sectional shapes on the X-Y plane of the first and second contact interconnects CT1 and CT2 are the same. Specifically, the sectional shape on the X-Y plane of each of the first and second contact interconnects CT1 and CT2 is substantially a rectangle. In the first and second contact interconnects CT1 and CT2, the direction of the long sides of these substantial rectangles is the same. The size of this substantial rectangle is preferably the same for all. Such a layout of the transfer transistors TTr is referred to as a layout LY2.

In the example illustrated in FIG. 7, the long sides of the shapes (substantially rectangular) of the first and second contact interconnects CT1 and CT2 follow the X-axis direction. In the example illustrated in FIG. 4, the first contact interconnects CT1 are arranged such that the long sides of the transfer transistors TTr follow the gate width direction. Therefore, in the example illustrated in FIG. 7, since the long sides of all the first contact interconnects CT1 are arranged in the X-axis direction, the area occupied by the transfer transistors TTr in this layout LY2 is larger illustrated in FIG. 4 than that in the layout LY1 illustrated in FIG. 4. However, since the shapes of the first and second contact interconnects CT1 and CT2 are the same, accuracy of photolithography can be improved when the first and second contact interconnects CT1 and CT2 are fabricated. Therefore, variation in manufacture of the semiconductor memory device can be reduced.

(Third Embodiment)

Figure 8:
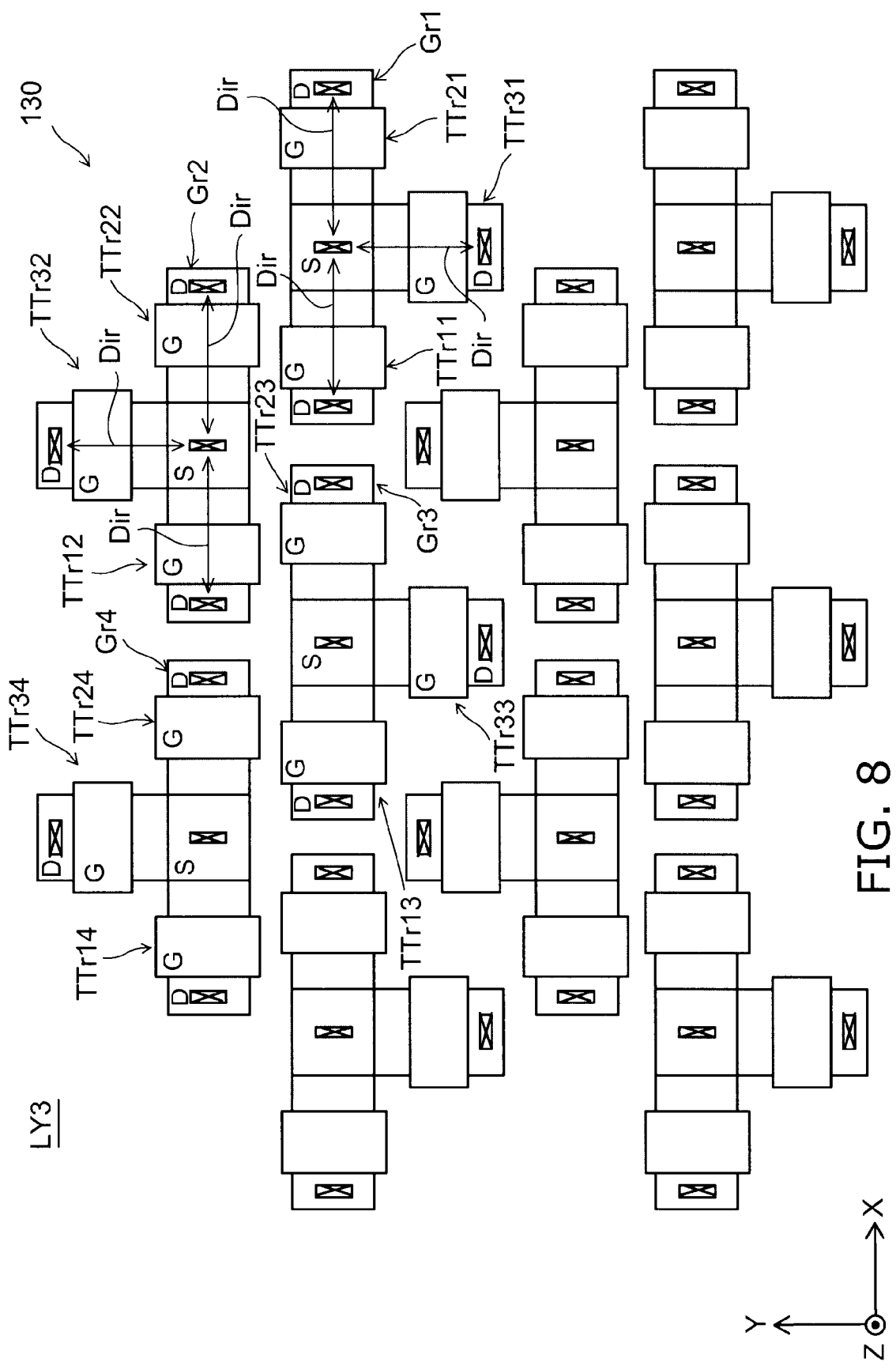

FIG. 8 is a schematic plan view for explaining a third embodiment.

In FIG. 8, a layout of the transfer transistors TTr of a semiconductor memory device 130 according to the third embodiment is exemplified.

In this layout of the transfer transistors TTr, three transfer transistors constitute one transistor group Gr. That is, the other ends (drains or sources) in the current path of a first transfer transistor, a second transfer transistor, and a third transfer transistor are provided commonly.

Also, assuming that the direction in which the respective drains D and sources S of the second transfer transistor and the third transfer transistor is a direction Dir, the direction Dir of the two transfer transistors in the three transfer transistors are different from each other by 180°. Also, the direction Dir of the remaining one transfer transistor is different from the directions of the other two transfer transistors by 90°, respectively.

That is, in one transistor group Gr, the layout of the three transfer transistors TTr is a so-called T-shaped layout. Such a layout of the transfer transistors TTr is referred to as a layout LY3.

Also, the plurality of transistor groups Gr are arranged in the matrix state. Moreover, the adjacent transistor groups Gr are arranged alternately in the row direction and in the column direction, respectively. Furthermore, in the two transistor groups Gr adjacent in the Y-axis direction, the layout of the three transfer transistors TTr are reversed along the axis in the X-axis direction.

In the layout of the adjacent transistor groups Gr, the transfer transistors TTr are arranged so that the transfer transistors TTr in which a voltage is applied to the gates at the same time are not arranged too close to each other.

By means of such a layout of the transistor groups Gr, the area occupied by the transfer transistors TTr can be made smaller than that when the transfer transistors TTr are independently arranged.

(Fourth Embodiment)

Figure 9:
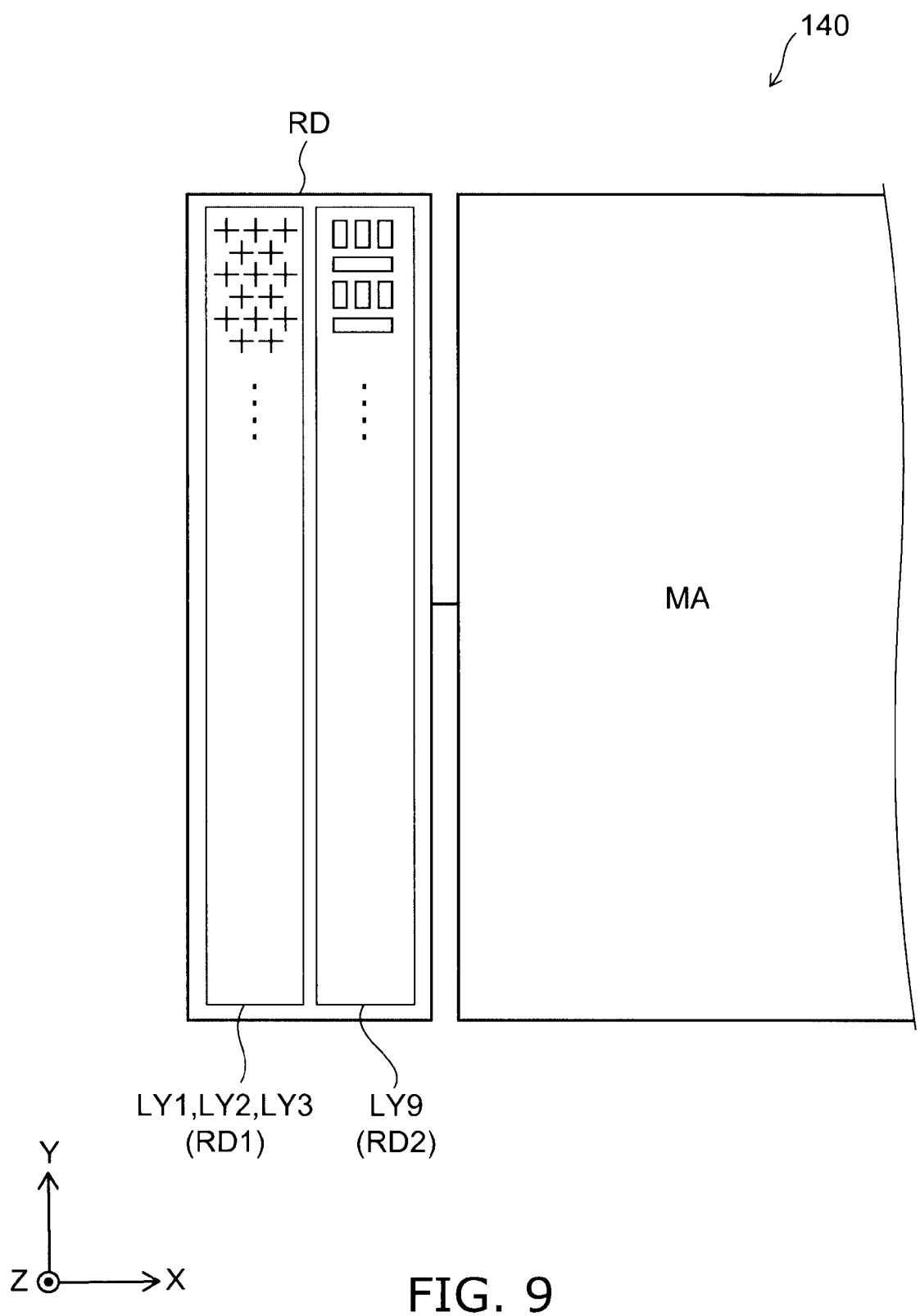

FIG. 9 is a schematic plan view for explaining a fourth embodiment.

In FIG. 9, a layout of the memory array MA and the row decoder RD is schematically illustrated.

That is, in a semiconductor memory device 140 according to the fourth embodiment, the layout LY1 of the four transfer transistors TTr described above is applied to a part RD1 (first region) of the row decoder RD. The layouts LY2 and LY3 may be applied to the part RD1 of the row decoder RD, instead of the layout LY1. To another part RD2 (second region) of the row decoder RD, the layout LY9 according to the reference example exemplified in FIG. 6, for example, is applied.

The part RD1 of the row decoder RD to which the layout LY1 is applied is preferably positioned farther from the memory array MA than another part RD2. That is, the closer it is located to the memory array MA, the closer the pitch of the word line WL in the Y-axis direction becomes to the pitch of the memory cell MC in the Y-axis direction. If it becomes closer to the pitch of the memory cell MC, freedom in wiring becomes low. In the layout LY9, since the wiring is simple, wiring is easy. Thus, the layout LY9 is suitable for the arrangement of the part RD2 closer to the memory array MA in the regions of the row decoder RD. On the other hand, by applying the layouts LY1, LY2, and LY3 to the part RD1 farther from the memory array MA, arrangement can be made without being restricted by wiring due to the pitch of the memory cell MC. As a result, the occupied area of the peripheral circuit can be reduced.

The embodiments have been described, but the invention is not limited by these examples. For example, in the layouts of the transfer transistors TTr, the directions Dir1, Dir2, Dir3 and Dir4 do not have to be in the X-axis direction or in the Y-axis direction.

Also, in the embodiment, the transfer transistor TTr is exemplified as the transistor constituting the transistor group Gr, but the transistor group Gr may be constituted by the other transistors included in the row decoder RD or a transistor connected to the selection gate electrodes SGS and SDG, for example.

Also, in the embodiments, the NAND-type flash memory has been described, but the embodiments of the invention are not limited to that and can be applied to semiconductor memory in general including volatile memory such as DRAM (Dynamic Random Access Memory), SRAM (Static Random Access Memory) and the like, nonvolatile memory such as NOR-type flash memory, FeRAM (Ferroelectric Random Access Memory), MRAM (Magnetic Random Access Memory) and the like.

Also, devices obtained by those skilled in the art by adding, deleting or changing the designs of the constituent elements of each of the embodiments as appropriate or devices in which features in embodiments are combined as appropriate are included in the scope of the invention as long as it is provided with the gist of the invention.

As described above, according to the semiconductor memory device according to the embodiment, the area occupied by the peripheral circuit arranged in the periphery of the memory array can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
a memory array including:
    a plurality of memory cells arranged on a substrate in a matrix state;
    a plurality of word lines, each of the word lines commonly connected to the memory cells in a common row among the plurality of memory cells; and
    a plurality of bit lines, each of the bit lines commonly connected to the memory cells in a common column among the plurality of memory cells,
    a first block, a second block, and a third block being set in the order along the bit line and including the plurality of memory cells; and
a peripheral circuit including:
    a transistor group formed on the substrate having:
        a first transfer transistor, one of a source and a drain of the first transfer transistor being connected to a part of the word lines belonging to the first block;
        a second transfer transistor, one of a source and a drain of the second transfer transistor being connected to a part of the word lines belonging to the second block; and
        a third transfer transistor, one of a source and a drain of the third transfer transistor being connected to a part of the word lines belonging to the third block,
    the first transfer transistor, the second transfer transistor, and the third transfer transistor sharing one other of the source and the drain, and
a direction connecting the source to the drain in each of the first transfer transistor, the second transfer transistor, and the third transfer transistor being different from each other by 90° or 180°.

2. The device according to claim 1, wherein
the memory array further includes a fourth block subsequently to the first block, the second block, and the third block being set in the order along the bit line, and
the peripheral circuit further has a fourth transfer transistor, one of a source and a drain of the fourth transfer transistor being connected to a part of the word lines belonging to the fourth block,
the first transfer transistor, the second transfer transistor, the third transfer transistor, and the fourth transfer transistor sharing the other of the source and the drain, and
a direction connecting the source to the drain in each of the first transfer transistor, the second transfer transistor, the third transfer transistor, and the fourth transfer transistor being different from each other by 90° or 180°.

3. The device according to claim 2, wherein
the direction of the first transfer transistor and the direction of the fourth transfer transistor are different from each other by 180°,
the first transfer transistor is arranged at a position closer to the first block than the fourth transfer transistor, and
the fourth transfer transistor is arranged at a position closer to the fourth block than the first transfer transistor.

4. The device according to claim 2, wherein
the peripheral circuit has a plurality of the transistor groups,
arrangement of the first transfer transistor, the second transfer transistor, the third transfer transistor, and the fourth transfer transistor in each of the plurality of transistor groups being equal.

5. The device according to claim 3, wherein
the peripheral circuit has a plurality of the transistor groups, and
arrangement of the first transfer transistor, the second transfer transistor, the third transfer transistor, and the fourth transfer transistor in each of the plurality of transistor groups being equal.

6. The device according to claim 4, wherein
the plurality of transistor groups are arranged in the matrix state and the adjacent transistor groups are arranged with a shift in each of the row direction and the column direction by a half pitch.

7. The device according to claim 1, wherein:
the peripheral circuit has
a first contact interconnect provided on either of the source and the drain, and
a second contact interconnect provided on the other of the source and the drain,
a longer direction in a cross section parallel to the substrate of the first contact interconnect being same as a longer direction in a cross section parallel to the substrate of the second contact interconnect.

8. The device according to claim 1, wherein
the transistor groups are provided in a part of the peripheral circuit away from the memory array.

9. The device according to claim 1, wherein
the first transfer transistor, the second transfer transistor, and the third transfer transistor drive for the first block, the second block, and the third block, respectively.

10. The device according to claim 2, wherein
the first transfer transistor, the second transfer transistor, the third transfer transistor, and the fourth transfer transistor drive for the first block, the second block, the third block, and the fourth block, respectively.

11. The device according to claim 1, wherein
the shape of a subscribed rectangle of the transistor group as viewed in a direction orthogonal to the substrate is a regular square.

12. The device according to claim 1, wherein
a distance from the source to an end of the drain of the first transfer transistor, a distance from the source to an end of the drain of the second transfer transistor, and a distance from the source to an end of the drain of the third transfer transistor are equal.

13. The device according to claim 2, wherein
a distance from the source to an end of the drain of the first transfer transistor, a distance from the source to an end of the drain of the second transfer transistor, a distance from the source to an end of the drain of the third transfer transistor, and a distance from the source to an end of the drain of the fourth transfer transistor are equal.

14. The device according to claim 1, wherein
the peripheral circuit has a plurality of the transistor groups,
the plurality of transistor groups being arranged in a matrix state, and
the layout of the first transfer transistors, the second transfer transistors, and the third transfer transistors of the two transistor groups adjacent in the column direction being reversed with respect to the axis along the row direction.

15. The device according to claim 1, wherein
the peripheral circuit has a first region and a second region closer to the memory array than the first region,
the first region includes the first transfer transistor, the second transfer transistor, and the third transfer transistor, and
the second region includes a fifth transfer transistor and a sixth transfer transistor adjacent to the fifth transfer transistor,
a direction connecting the source to the drain of the fifth transfer transistor and a direction connecting the source to the drain of the sixth transfer transistor being different from each other by 90°.

16. The device according to claim 2, wherein
the peripheral circuit has a first region and a second region closer to the memory array than the first region,
the first region includes the first transfer transistor, the second transfer transistor, the third transfer transistor, and the forth transfer transistor, and
the second region includes a fifth transfer transistor and a sixth transfer transistor adjacent to the fifth transfer transistor,
a direction connecting the source to the drain of the fifth transfer transistor and a direction connecting the source to the drain of the sixth transfer transistor being different from each other by 90°.

* * * * *